(12) United States Patent
Kaundinya et al.

(10) Patent No.: US 10,756,538 B2
(45) Date of Patent: Aug. 25, 2020

(54) CURRENT LIMITING FOR HIGH CURRENT DRIVERS

(71) Applicant: Silicon Laboratories Inc., Austin, TX (US)

(72) Inventors: Pranav R. Kaundinya, Austin, TX (US); Sean A. Lofthouse, Pflugerville, TX (US)

(73) Assignee: Silicon Laboratories Inc., Austin, TX (US)

( * ) Notice: Subject to any disclaimer, the term of this patent is extended or adjusted under 35 U.S.C. 154(b) by 350 days.

(21) Appl. No.: 15/495,336

(22) Filed: Apr. 24, 2017

(65) Prior Publication Data
US 2018/0309286 A1 Oct. 25, 2018

(51) Int. Cl.
| | |
|---|---|
| *H02H 9/04* | (2006.01) |
| *H02H 9/02* | (2006.01) |
| *B60L 3/04* | (2006.01) |
| *H02H 3/44* | (2006.01) |
| *H02H 3/087* | (2006.01) |
| *H01H 83/20* | (2006.01) |
| *H02H 3/08* | (2006.01) |
| *H03K 17/082* | (2006.01) |

(52) U.S. Cl.
CPC ............ *H02H 9/04* (2013.01); *H02H 9/02* (2013.01); *H02H 9/025* (2013.01); *B60L 3/04* (2013.01); *H01H 83/20* (2013.01); *H02H 3/08* (2013.01); *H02H 3/087* (2013.01); *H02H 3/44* (2013.01); *H03K 17/0822* (2013.01)

(58) Field of Classification Search
USPC .................................. 361/86–87, 93.7–93.9
See application file for complete search history.

(56) References Cited

U.S. PATENT DOCUMENTS

| | | | | |
|---|---|---|---|---|
| 5,126,659 A | * | 6/1992 | Edwards | G01R 31/31701 324/537 |
| 6,414,404 B1 | * | 7/2002 | Allen | H03K 17/0822 307/130 |
| 6,429,633 B1 | * | 8/2002 | Kajiwara | H03K 17/164 323/282 |

(Continued)

OTHER PUBLICATIONS

Linear Technology "LT1910 Protected High Side MOSFET Driver," Linear Technology Corporation, 2009, pp. 1-14.

(Continued)

*Primary Examiner* — Danny Nguyen
(74) *Attorney, Agent, or Firm* — Zagorin Cave LLP

(57) ABSTRACT

A technique for operating a driver includes enabling the driver to provide a first current through a first terminal of a driver device of the driver in a first mode of operation. The method includes sensing a voltage drop across the first terminal and a second terminal of the driver device to generate a sensed voltage level indicative of the voltage drop. The method includes generating a comparison output signal indicative of a comparison of the sensed voltage level to a threshold voltage level. The method includes selectively enabling the driver to provide a second current in a second mode of operation based on the comparison output signal. The first current may be less than the second current. The enabling may include enabling a first portion of the driver device using a first control signal, while a second portion of the driver device is disabled using a second control signal.

17 Claims, 3 Drawing Sheets

(56) References Cited

U.S. PATENT DOCUMENTS

| | | | |
|---|---|---|---|
| 7,111,178 B2 | 9/2006 | Rusu | |
| 7,368,898 B2 * | 5/2008 | Sutardja | H02M 1/088 |
| | | | 323/283 |
| 7,532,448 B2 * | 5/2009 | So | H02H 3/006 |
| | | | 361/93.3 |
| 7,710,701 B1 * | 5/2010 | Mei | H02H 7/1213 |
| | | | 361/57 |
| 9,489,000 B2 | 11/2016 | Caffee et al. | |
| 9,864,018 B2 | 1/2018 | Lee | |
| 9,882,504 B2 | 1/2018 | Lee | |
| 2008/0074820 A1 | 3/2008 | Thiery | |
| 2009/0303647 A1 * | 12/2009 | Bauer | H02H 3/046 |
| | | | 361/87 |
| 2010/0295521 A1 * | 11/2010 | Odaohhara | G06F 1/26 |
| | | | 323/282 |
| 2010/0308872 A1 * | 12/2010 | Gillberg | H01L 21/823487 |
| | | | 327/108 |
| 2014/0028213 A1 | 1/2014 | Sood | |
| 2014/0177287 A1 | 6/2014 | Cho | |
| 2015/0369856 A1 | 12/2015 | Takala | |
| 2016/0020716 A1 | 1/2016 | Skinner | |
| 2016/0105118 A1 | 4/2016 | Ji | |
| 2016/0334280 A1 | 11/2016 | Hasan | |
| 2017/0317619 A1 | 11/2017 | Balasubramanian | |
| 2018/0183228 A1 | 6/2018 | Huber | |

OTHER PUBLICATIONS

Infineon, "ISO2H823V2.5 Galvanic Isolated 8 Channel High-Side Switch," Power Management & Multimarket Datasheet Revision 2.0, Feb. 12, 2015, pp. 1-9.

ST, "Galvanic isolated octal high-side smart power solid state relay," Datasheet ISO8200B, Apr. 2014, pp. 1-35.

* cited by examiner

CURRENT LIMITING FOR HIGH CURRENT DRIVERS

BACKGROUND

Field of the Invention

This invention relates to integrated circuits and more particularly to integrated circuits providing an interface to a load.

Description of the Related Art

In a typical control application, a processor system provides one or more control signals for controlling a load system (e.g., mechanical actuators, including solenoids, relays, or motors). The driver system typically uses a voltage converter and an output driver to provide one or more control signals at voltage levels suitable for the load system. Referring to FIG. 1, in an exemplary application, driver system 130 receives one or more signals for driving load 140 operating using a high voltage. Load 140 requires a substantial turn-on voltage (e.g., voltages in the range of tens of Volts) and is susceptible to fault conditions that may damage one or more devices in load 140. For example, when a short circuit current condition exists, high current flows into load 140 which may destroy devices in load 140. Accordingly, techniques for driving a high-power load without damaging the load are desired.

SUMMARY OF EMBODIMENTS OF THE INVENTION

In at least one embodiment of the invention, a circuit includes a driver device, a sensing circuit, and a control circuit. The driver device includes a first control terminal responsive to a first control signal, a second control terminal responsive to a second control signal, a first terminal, and a second terminal. One of the first terminal and the second terminal is configured as an output terminal of the driver device and another of the first terminal and the second terminal is coupled to a power supply terminal. The sensing circuit is coupled to the first terminal and the second terminal and is configured to generate a sensed voltage level indicative of a voltage drop across the first terminal and the second terminal. The control circuit is configured to generate the second control signal based on the sensed voltage level. The first control signal may be configured to selectively enable at most 50% of the driver device and the second control signal may be configured to selectively enable at least 50% of the driver device.

In at least one embodiment of the invention, a method of operating a driver includes enabling the driver to provide a first current through a first terminal of a driver device of the driver in a first mode of operation. The method includes sensing a voltage drop across the first terminal and a second terminal of the driver device to generate a sensed voltage level indicative of the voltage drop. The method includes generating a comparison output signal indicative of a comparison of the sensed voltage level to a threshold voltage level. The method includes selectively enabling the driver to provide a second current in a second mode of operation based on the comparison output signal. The first current may be less than the second current. The enabling may include enabling a first portion of the driver device using a first control signal, while a second portion of the driver device is disabled using a second control signal. The first portion may be distributed among the second portion of the driver device. Enabling the driver may enable the first mode from an off-state of the driver. Selectively enabling the driver in the first mode may be from the second mode in response to the comparison output signal indicating the sensed voltage level is greater than a threshold voltage level.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
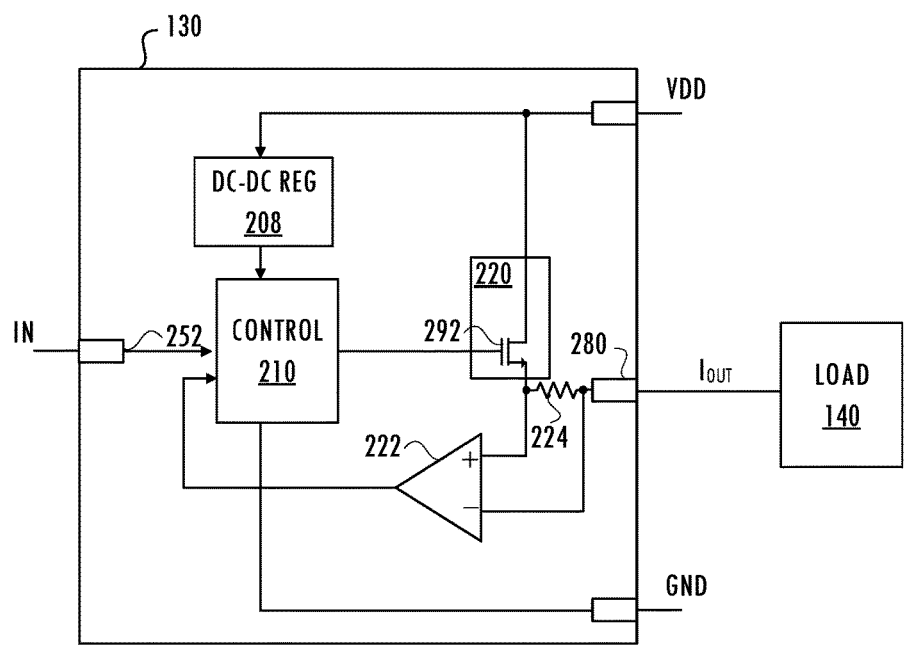
FIG. 1 illustrates a circuit diagram of an interface integrated circuit including a conventional driver system coupled to a load.
Figure 2:
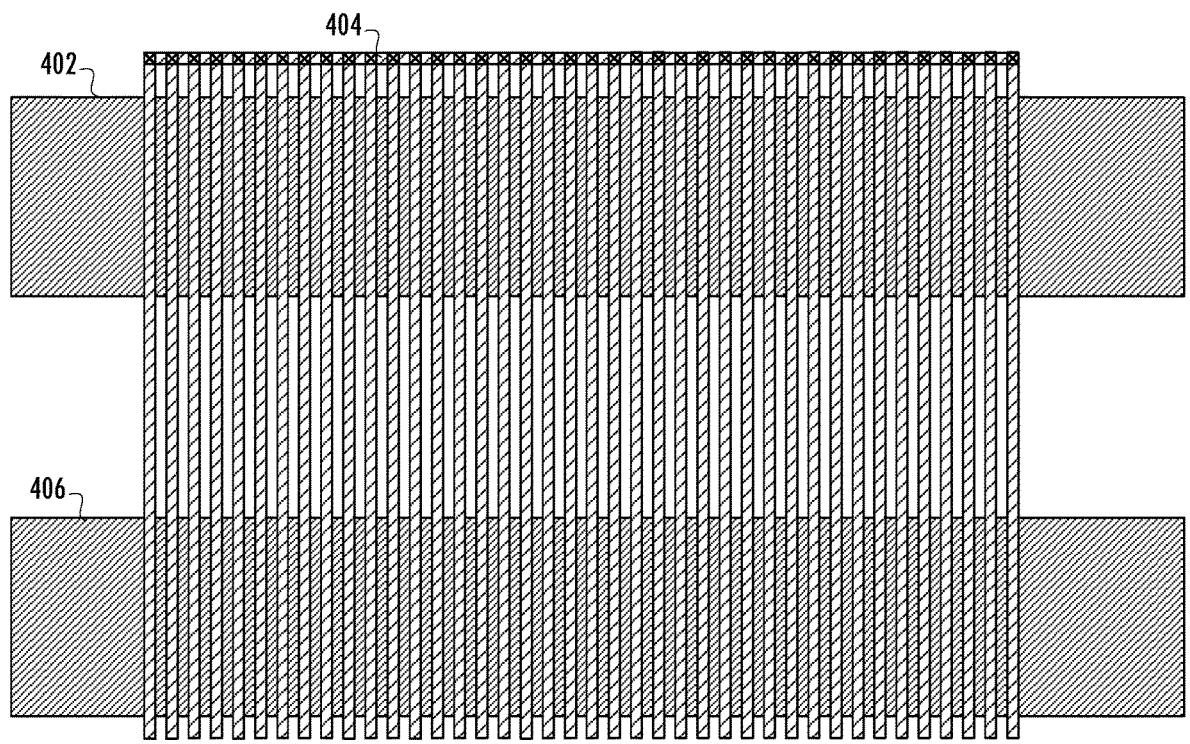
FIG. 2 illustrates a plan view of an exemplary physical design for the driver device of FIG. 1.

Referring to FIGS. 1 and 2, in an exemplary control application, control logic 210 receives a signal via port 252 and provides one or more signals for a high-power load system operating using high voltage supply VDD. Voltage converter and regulator 208 provides a suitable voltage for control logic 210, which may be a substantially lower voltage level (e.g., 5 V or 3 V) than VDD (e.g., 10V). Driver device 220 includes transistor 292, which includes gate terminals implemented using one or more fingers of conductive material (e.g., polysilicon) extending over doped regions of semiconductor material (e.g., region 402 and region 406). To form a transistor of sufficient size and to be consistent with typical semiconductor manufacturing design rules, multiple conductive fingers are used and coupled together to form gate terminal 404 responsive to a control signal. With proper biasing, a channel region forms beneath the conductive fingers and extends between doped region 402 and doped region 406, in response to the control signal on gate terminal 404 producing a sufficient gate-to-source voltage.

Driver device 220 includes transistor 292, which is relatively large to achieve a low on-resistance (e.g., an on-resistance on the order of hundreds of milli-Ohms (mΩ)), driver device 220 includes one or more power metal-oxide-semiconductor field-effect transistors (MOSFETs), insulated-gate bipolar transistors (IGBTs), Gallium-Nitride (GaN) MOSFETs, Silicon-Carbide power MOSFETs, and other suitable devices able to deliver high currents over short periods of time. Driver device 220 can source or sink large amounts of current. For example, a 100 mΩ, 36 V driver can dissipate over 1 kW of power in response to a short circuit event. Current-limiting protects driver device 220 against short-circuit or other fault conditions. Driver device 220 is coupled to sense resistor 224 (e.g., 30 mΩ) and operational amplifier 222 in a fold-back scheme that senses the current through driver device 220 and limits the output voltage and output current in response to detecting a fault event based on the sensed current. The conventional fold-back scheme includes sense resistor 224 coupled in series with driver device 220. However, some applications limit the resistance of a driver (e.g., to 150 mΩ), which is not conducive to using a fold-back scheme that includes a sense resistor coupled in series with the driver device 220.

A current-limiting technique for driving a load provides a current-limited output signal in response to a fault event (e.g., a short circuit event) using a driver having a low on-resistance. The current-limiting technique is compatible high-side or low-side applications without modification. The current-limiting technique does not use a sense resistor in series with the driving device, thus facilitating a lower on-resistance of the driver than conventional techniques. The driver turns on faster and operates at a higher frequency than conventional high-power drivers (e.g., operates at frequencies in the hundreds of kHz). The current-limiting technique reduces or eliminates the likelihood of turning on the driver into a fault condition and allows parasitic capacitances to be charged using a limited current. In addition, the current-limiting technique can exit a current-limited mode of operating the driver into a normal mode of operating the driver in response to removal of the fault condition.

Figure 3:
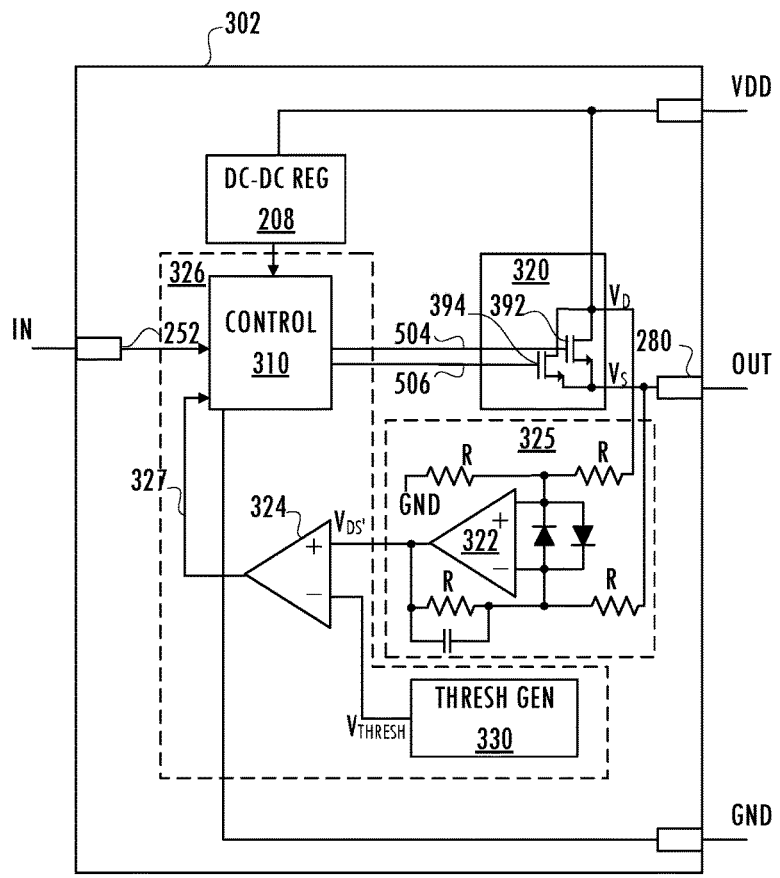
FIG. 3 illustrates a circuit diagram of an interface integrated circuit including a high-side driver implementing a current limiting technique consistent with at least one embodiment of the invention.

Referring to FIG. 3, driver 302 includes control circuit 326 and sensing circuit 325 that form relatively fast and thermally effective current-limiting protection circuitry that allows driver device 320 to be used in high-side or low-side configurations without modifications to the current-limiting protection circuitry. Sensing circuit 325 does not require a sense resistor in series with driver device 320, thus enabling a lower driver on-resistance, and allowing driver device 320 to be configured as either a high-side or low-side switch. Control logic 310 configures driver device 320 in a current-limited mode in response to a power-on event, thereby preventing driver device 320 from turning on into a short circuit or other fault condition and allowing parasitic capacitances to be charged using a limited current. In addition, operating in the current-limited mode in response to the power-on event results in a faster effective turn-on time and allows driver device 320 to be operated in a high-frequency mode in which driver device 320 continuously operates. The current-limiting technique transitions between the current-limited mode of operation and normal operation (e.g., driving a full current output), allowing the driver to continue to drive the load during fault events.

Driver device 320 includes at least two separately controllable portions. Control circuit 326 controls first portion 392 independently from second portion 394 of driver device 320 using control signal 504 and control signal 506, respectively. Control logic 310 generates those control signals based on the input signal and a fault indication signal 327, which is based on a sensed voltage drop across the drain node of driver device 320 and the source node of driver device 320 (e.g., sensed voltage $V_{DS}'$). Sensing circuit 325 includes difference amplifier 322 coupled to large feedback resistors to accommodate a wide range of input voltage levels. Difference amplifier 322 includes an operational amplifier having a high voltage input stage and a low voltage output stage. Parallel back-to-back diodes between the input terminals of difference amplifier 322 protect the input stage and contribute to the amplifier feedback in response to saturation of the input to difference amplifier 322.

During normal operation, sensing circuit 325 continuously monitors the voltage drop across drain and source terminals of driver device 320. Control circuit 326 compares sensed voltage $V_{DS}'$ to predetermined threshold voltage $V_{THRESH}$, which is generated by threshold generator 330. Predetermined threshold voltage $V_{THRESH}$ is determined by thermal simulation or other suitable techniques. In at least one embodiment, threshold generator 330 includes a replica device placed sufficiently near driver device 320 so that process and temperature variations similarly affect the replica device and the one or more transistors included in driver device 320. The replica device may be a fraction of the size of driver device 320. For example, a width of the replica device is at least two orders of magnitude less than a corresponding width of one or more transistor in driver device 320.

In response to the output of difference amplifier 324, which indicates whether an overcurrent event has occurred, control logic 310 selectively configures driver device 320 in a current-limited mode of operation by selectively disabling a substantial portion of driver device 320 (e.g., by turning off second portion 394 using control signal 506). In response to second portion 394 being disabled, the drive strength of driver device 320 decreases and the one or more transistors in first portion 392 enter saturation (e.g., using control signal 504). In addition, in the current-limited mode of operation, the gate-to-source voltage of first portion 392 can be less than the gate-to-source voltage of driver device 320 when it is fully enabled. For example, the gate-to-source voltage of driver device 320 is 5 V when it is fully enabled and the gate-to-source voltage of driver device 320 is 2.5 V when only first portion 392 is enabled and second portion 394 is disabled. Control logic 310 adjusts the gate-to-source voltage of driver device 320 accordingly when transitioning between the current-limited mode of operation and a fully enabled mode of operation in addition to enabling or disabling second portion 394.

Sensing circuit 325 continues to monitor $V_{DS}$ of driver device 320 and when the overload condition is removed (e.g., when $V_{DS}$ becomes low enough), driver device 320 exits the current-limited mode by enabling the disabled portion of the driver to enter a normal mode of operation. Since control circuit 326 does not include any analog feedback loops in the gate control path, the current-limiting protection circuitry uses a simple gate drive circuit that responds quickly to events (e.g., short-circuit events).

In at least one embodiment of the current-limiting technique, when driver device 320 is turned on, it starts up in the current-limited mode of operation. For example, only a portion of driver device 320 is enabled from an off-state (i.e., from a state in which no current flows through output port 280) and the current-limiting protection circuitry monitors the voltage difference between the drain node voltage VD and the source node voltage Vs (i.e., voltage $V_{DS}$). In response to sensing a sufficiently low level of voltage $V_{DS}$, as indicated by sensed voltage $V_{DS}'$ being below the predetermined threshold voltage $V_{THRESH}$, control circuit 326 enables one or more portion of driver device 320 (e.g., second portion 394) using control signal 504. Initially, capacitance on output port 280 appears to driver device 320 as a short circuit and subsequently, as an overload condition, until that capacitance is charged to its steady state value. By starting up in the current-limited mode of operation, driver device 320 charges any output capacitance using a limited current, thereby preventing large overload currents through driver 392. In addition, starting up in the current-limited mode of operation prevents driver device 320 from inadvertently starting up in a short circuit and allows driver device 320 to automatically restart after a fault condition without the risk of repeatedly running large currents through driver device 320. Moreover, the current-limiting technique prevents large overload currents through driver 392 in applications having loads that require large inrush currents (e.g., DC motors and incandescent bulbs). Those loads behave like short circuits for a short duration of time when first energized. For example, when first energized, an incandescent bulb has a filament resistance that is one tenth its nominal resistance. As the thermal state of the filament increases, its resistance increases and eventually reaches the nominal resistance. Similarly, high current flows through coils of a DC motor until the motor increases speed and develops a back electromotive force.

The two-step turn on sequence of the current-limiting technique results in a faster effective turn-on time. In at least one embodiment, first portion 392 is a small fraction of driver device 320 (e.g., 5%) and turns on quickly since the gate-drive circuitry only needs to charge a relatively small gate capacitance. For a driver with a low on-resistance, even first portion 392 has a relatively small resistance compared to the load (5% of a 100 mΩ driver would have a resistance of only 2Ω which is usually much smaller than the load resistance, which could be around 50Ω). Therefore, driver device 320 starts sourcing (or sinking) nearly all of a nominal steady-state current as soon as first portion 392 of driver device 320 is on. Note that if the entire driver (e.g., both first portion 392 and second portion 394) were to be turned on simultaneously from an off-state, hardly any current would flow through the driver until the capacitance of the gate node is charged to a threshold voltage above the source voltage.

Using only first portion 392 in the current-limited mode of operation allows driver device 320 to operate at higher frequencies than the conventional high-power driver of FIG. 1. Referring back to FIG. 3, when driver device 320 is toggled at a high frequency, it continually operates in the current-limited mode. The operating frequency of a driver is often limited by the gate drive circuitry, which in a high side configuration may require a charge pump. Operating only first portion 392 reduces loading on the gate drive circuitry and allows driver device 320 to achieve a sufficiently fast turn-on time. Moreover, at higher frequencies, a greater fraction of time is spent in switching, and switching losses begin to dominate the overall thermal dissipation. A reduced drive strength and faster turn-on/turn-off results in decreased switching loss. Therefore, operating driver device 320 in the current-limited mode of operation reduces thermal dissipation despite an increased on-resistance.

Figure 4:
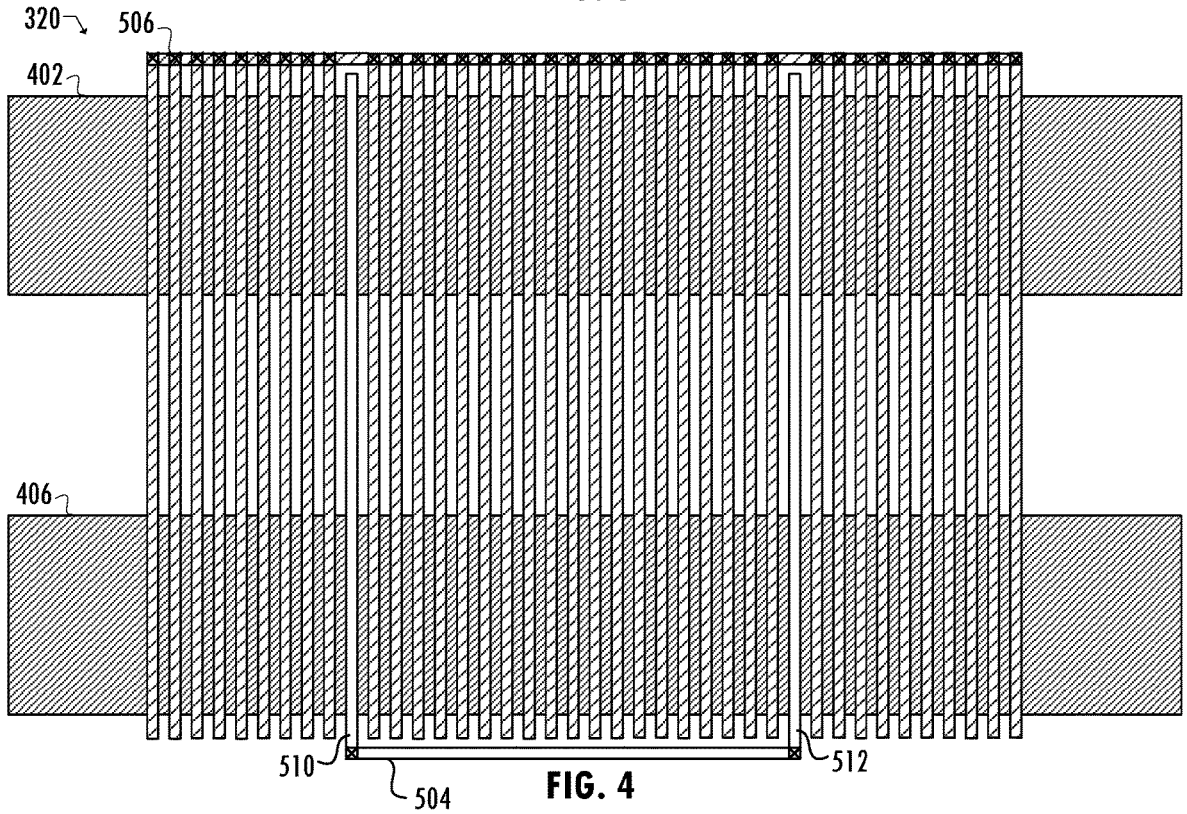
FIG. 4 illustrates a plan view of an exemplary physical design for the driver device of FIG. 3 consistent with at least one embodiment of the invention.

Referring to FIGS. 3 and 4, in at least one embodiment, driver device 320 includes one or more power metal-oxide-semiconductor field-effect transistors (MOSFETs), insulated-gate bipolar transistors (IGBTs), Gallium-Nitride (GaN) MOSFETs, Silicon-Carbide power MOSFETs, and other suitable devices able to deliver high currents over short periods of time. Driver device 320 is partitioned into at least two portions, but other embodiments use multiple portions, additional corresponding control signals, and additional current level modes of operation. Each portion includes a separately controllable gate terminal, which may be implemented using one or more fingers of conductive material (e.g., polysilicon) extending over doped regions of semiconductor material (e.g., region 402 and region 406). With proper biasing, one or more channel regions form beneath the conductive fingers extending between doped region 402 and doped region 406, in response to a control signal on gate terminal 504 having a sufficient gate voltage. The size of the one or more channels and associated drive strength of driver device 320 varies with the physical design of the transistor formed by first portion 392 and second portion 394.

In an exemplary embodiment of driver device 320, first portion 392 is controlled by conductive fingers coupled to control signal 504 (hatched conductive fingers in FIG. 4) and the second portion is controlled by conductive fingers 510 and 512, which are coupled to control signal 506. First portion 392 and second portion 394 receive separate gate control signals, i.e., control signal 504 and control signal 506, respectively. In the current-limited mode of operation, control signal 504 has a voltage level sufficient to turn on first portion 392 (e.g., the regions controlled by conductive fingers 510 and 512) and the second control signal has a second voltage level that maintains the second portion (e.g., the regions controlled by hatched conducive fingers) in an off state. In the normal mode of operation, control signal 504 has a voltage level sufficient to turn on first portion 392 (e.g., the regions controlled by conductive fingers 510 and 512) and control signal 506 has a voltage level sufficient to turn on second portion 394 (e.g., the regions controlled by hatched conducive fingers), thereby entirely enabling driver device 320.

Note that first portion 392, which operates during the current-limited mode of operation and the normal mode of operation, may be distributed across the entirety of driver device 320 for improved thermal performance. The size of the individual segments may be selected based on thermal modelling. However, in other embodiments of driver device 320, first portion 392 includes adjacent conductive fingers concentrated at a particular location. In addition, while driver device 320 is illustrated as having rectangular geometry, in other embodiments, driver device 320 has other geometries (e.g., L-shaped) based on power management or manufacturability considerations. In addition, although FIG. 4 illustrates first portion 392 including 5% of driver device 320 and second portion 394 including 95% of driver device 320, other ratios and allocations of conductive fingers may be used (e.g., first portion 392 including at most 50% of driver device 320 and second portion 394 including at least 50% of driver device 320). In addition, note that in other embodiments of driver device 320, each of first portion 392 and second portion 394 may be formed from one or more distinct transistors coupled in parallel. Furthermore, note that other embodiments enable a first portion mutually exclusively from enablement of a second portion.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

Figure 5:
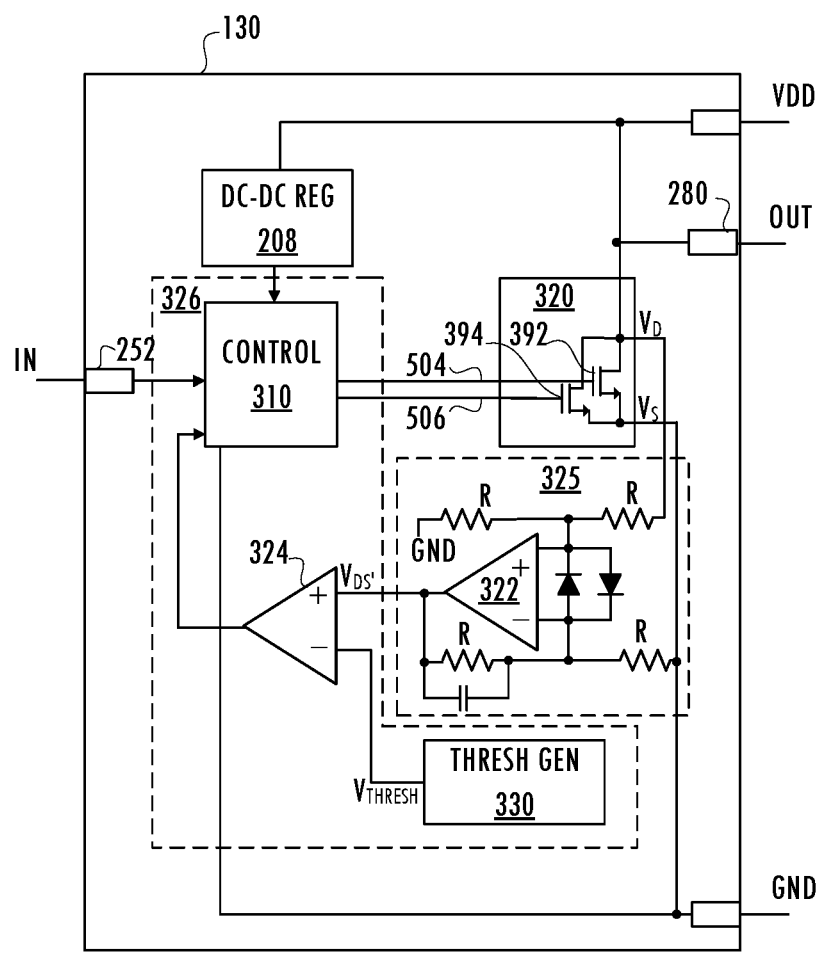
FIG. 5 illustrates an interface integrated circuit including a driver implementing a current limiting technique consistent with at least one embodiment of the invention.

Thus, current-limiting techniques for high-power drivers that may be used in high-side or low-side applications without modification have been disclosed. The current limiting technique allows the driver to turn on faster and operate at a higher frequency than conventional high-power drivers. In addition, the current-limiting technique improves the resilience of the driver as compared to completely shutting off the driver in response to brief transients, which may be common in noisy environments. The description of the invention set forth herein is illustrative, and is not intended to limit the scope of the invention as set forth in the following claims. For example, while the invention has been described in embodiments having the high-powered driver in a high-side configuration (i.e., a source follower configuration), one of skill in the art will appreciate that the teachings herein can be utilized with the high-powered driver in a low-side configuration (i.e., open drain configuration), as illustrated in FIG. 5. Variations and modifications of the embodiments disclosed herein, may be made based on the description set forth herein, without departing from the scope of the invention as set forth in the following claims.

What is claimed is:

1. A circuit comprising:
   a driver device comprising:
      a first control terminal responsive to a first control signal;
      a second control terminal responsive to a second control signal;
      a first terminal; and
      a second terminal,
      wherein the first terminal or the second terminal is configured as an output terminal of the driver device and the other of the first terminal and the second terminal is coupled to a power supply terminal;
   a sensing circuit coupled to the first terminal and the second terminal and configured to generate a sensed voltage level indicative of a voltage drop across the first terminal and the second terminal; and
   a control circuit configured to generate the second control signal based on the sensed voltage level,
   wherein the first control signal is configured to selectively enable a small fraction of the driver device to charge an output capacitance using a limited current in response to a power-on event and the second control signal is configured to selectively enable a remaining fraction of the driver device after the output capacitance is charged to a steady-state value and the voltage drop falls below a predetermined threshold voltage, and
   wherein the driver device is an n-type MOSFET, the first terminal is a source terminal, the second terminal is a drain terminal, and the driver device further comprises a gate terminal partitioned into the first control terminal and the second control terminal.

2. The circuit, as recited in claim 1, wherein the source terminal is coupled to the power supply terminal, the drain terminal is configured as the output terminal, and the circuit is configured as a low-side current driver.

3. The circuit, as recited in claim 1, wherein the drain terminal is coupled to the power supply terminal, the source terminal is configured as the output terminal, and the circuit is configured as a high-side current driver.

4. The circuit, as recited in claim 1, wherein the first control signal is configured to selectively enable at least 1% and at most 5% of the driver device and the second control signal is configured to selectively enable at least 95% of the driver device.

5. The circuit, as recited in claim 1, wherein the first control terminal comprises a first plurality of conductive fingers and the second terminal comprises a second plurality of conductive fingers, the first plurality of conductive fingers being distributed among the second plurality of conductive fingers.

6. The circuit, as recited in claim 5, wherein the first control terminal is distributed evenly among the second control terminal and across a length of the driver device.

7. The circuit, as recited in claim 1, wherein the control circuit comprises:
   a replica device configured to generate a threshold voltage; and
   a comparator configured to compare the threshold voltage to the sensed voltage level and generate an indicator thereof.

8. The circuit, as recited in claim 7, wherein a width of the replica device is at least two orders of magnitude less than a corresponding width of the driver device.

9. A method for operating a driver comprising:
   enabling the driver to provide a first current through a first terminal of a driver device of the driver in a first mode of operation;
   sensing a voltage drop across the first terminal and a second terminal of the driver device to generate a sensed voltage level indicative of the voltage drop;
   generating a comparison output signal indicative of a comparison of the sensed voltage level to a threshold voltage level; and
   selectively enabling the driver to provide a second current in a second mode of operation based on the comparison output signal, wherein the first current charges an output capacitance using a limited current in response to a power-on event and the second current is selectively enabled after the output capacitance is charged to a steady-state value and the voltage drop falls below a predetermined threshold voltage,
   wherein the driver device is an n-type MOSFET, the first terminal is a source terminal, the second terminal is a drain terminal, and the driver device further comprises a gate terminal partitioned into a first control terminal and a second control terminal.

10. The method, as recited in claim 9, wherein the enabling comprises:
    enabling a first portion of the driver device using a first control signal, while a second portion of the driver device is disabled using a second control signal, the first portion being distributed among the second portion of the driver device.

11. The method, as recited in claim 10, wherein the selectively enabling comprises enabling the second portion of the driver device using the second control signal in response to the comparison output signal indicating the sensed voltage level is less than the threshold voltage level.

12. The method, as recited in claim 11, further comprising:
    generating the threshold voltage level using a replica device, the replica device being a second device of a same type as the driver device and having a dimension at least two orders of magnitude less than a corresponding dimension of the driver device.

13. The method, as recited in claim 9, wherein the enabling the driver enables the first mode from an off-state of the driver.

14. The method, as recited in claim 9, further comprising:
    selectively enabling the driver in the first mode from the second mode in response to the comparison output signal indicating the sensed voltage level is greater than the threshold voltage level.

15. The method, as recited in claim 9, wherein in the first mode, at least 1% and at most 5% of the driver device is enabled and in the second mode, the entire driver device is enabled.

16. The method, as recited in claim 9, wherein the selectively enabling the driver comprises:
generating a first driver control signal to control a first driver portion based on the comparison output signal; and
generating a second driver control signal to control a second driver portion based on the comparison output signal independently from the first driver portion.

17. The method, as recited in claim 11, wherein the first control signal is configured to selectively enable at least 1% and at most 5% of the driver device and the second control signal is configured to selectively enable at least 95% of the driver device.

* * * * *